(12) United States Patent
Laurent et al.

(10) Patent No.: US 8,058,967 B2
(45) Date of Patent: Nov. 15, 2011

(54) ELECTRICAL CONTROL DEVICE

(75) Inventors: Patrice Laurent, Viuz-en-Sallaz (FR);
Cédric Chartrain, La Roche sur Foron (FR)

(73) Assignee: Valeo Switches and Detection Systems - VSDS, Annemasse (FR)

(*) Notice: Subject to any disclaimer, the term of this patent is extended or adjusted under 35 U.S.C. 154(b) by 748 days.

(21) Appl. No.: 12/281,092

(22) PCT Filed: Feb. 2, 2007

(86) PCT No.: PCT/FR2007/000200
§ 371 (c)(1),
(2), (4) Date: Aug. 28, 2008

(87) PCT Pub. No.: WO2007/099209
PCT Pub. Date: Sep. 7, 2007

(65) Prior Publication Data
US 2010/0147666 A1    Jun. 17, 2010

(30) Foreign Application Priority Data
Mar. 1, 2006   (FR) ...................... 06 01856

(51) Int. Cl.
*H01C 10/10* (2006.01)
(52) U.S. Cl. ............... 338/47; 338/114; 338/212
(58) Field of Classification Search .............. 338/47, 338/13, 114, 154, 202, 210, 212
See application file for complete search history.

(56) References Cited

U.S. PATENT DOCUMENTS

| | | | | |
|---|---|---|---|---|
| 4,257,305 | A | * | 3/1981 | Friend et al. ............... 84/690 |
| 4,314,228 | A | | 2/1982 | Eventoff |
| 4,782,319 | A | * | 11/1988 | Dell'Acqua et al. ............ 338/4 |
| 6,072,130 | A | * | 6/2000 | Burgess ..................... 200/86 R |
| 6,275,138 | B1 | * | 8/2001 | Maeda ....................... 338/47 |
| 2002/0049464 | A1 | | 4/2002 | Donofrio et al. |
| 2002/0050919 | A1 | * | 5/2002 | Vance ........................ 338/47 |
| 2002/0058104 | A1 | | 5/2002 | Chen |

OTHER PUBLICATIONS

PCT Search Report of the EPO for PCT/FR2007/000200 dated Jul. 17, 2007.

* cited by examiner

*Primary Examiner* — Kyung Lee
(74) *Attorney, Agent, or Firm* — Daly, Crowley, Mofford & Durkee, LLP

(57) ABSTRACT

The invention concerns a touch-sensitive surface (15) electrical control device comprising at least two adjacent active zones (3, 5, 7) for controlling in each active zone (3, 5, 7) a specific electrical function and a coating (13) provided on the touch-sensitive surface (15) and having surface ribs (9) for delimiting said active control zones (3, 5, 7). The invention is characterized in that the lower surface (18) of a rib (9) separating two adjacent active zones is shaped like a tensioned vault (20) between posts (17) which are solely supported outside the active zones of the touch-sensitive surface (15).

19 Claims, 1 Drawing Sheet

ELECTRICAL CONTROL DEVICE

CROSS REFERENCE TO RELATED APPLICATIONS

This application claims the benefit of International Patent Application PCT/FR2007/000200 filed Feb. 2, 2007, published in the French language as WO2007/099209, which application claims priority from French application number FR0601856, filed Mar. 1, 2006.

The present invention relates to a tactile surface based electrical control device for example for a motorized mechanism for opening and/or closing at least one openable panel such as a motorized window, a sunroof, a trunk with motorized closing/opening assistance, a motorized tailgate or else a motorized sliding side door.

More recently, it has been proposed to use, for these controls, tactile surfaces making it possible to detect a simple bearing of the driver's finger and, as a function of the position of the detected bearing and/or of the subsequent movement of this bearing over the surface, to trigger a particular type of action or control of a vehicle member. Reference may be made for example to documents FR 2 798 329, FR 2 800 885 and U.S. Pat. No. 6,157,372. These tactile surfaces can be of any type and can use various technologies.

Thus for example the technology using pressure sensitive resistors (also known as FSR sensors, the initials standing for "Force Sensing Resistor"), is increasingly outstripping other equivalent technologies, such as for example capacitive or else optical technologies, by virtue of its ease of implementation and its robustness.

Such sensors are for example known as "digitizer pads" and the following documents are cited as prior art: U.S. Pat. Nos. 4,810,992, 5,008,497, FR 2683649 or else EP 0 541 102. These sensors comprise semi-conducting layers sandwiched between for example a conducting layer and a resistive layer. By exerting a pressure on the FSR layer, its ohmic resistance decreases, thus making it possible, by applying a suitable voltage, to measure the pressure applied and/or the location of the place where the pressure is exerted.

Though the use of tactile surfaces such as these is indisputably heading towards greater user-friendliness and increased compactness of control devices, it may on the other hand increase the risk of unintentional control error.

Thus, control modules with several adjacent active zones are known within the context of motorized openable panels such as windows, sunroof or else trunk and/or rear tailgate, for controlling specific electrical functions, such as for example opening, closing, or even the locking of an openable panel.

In these modules, the tactile sensor (there may be a plurality of sensors, for example one sensor per active zone) is covered with an overlay, for example a silicone skin, which exhibits ribs at the boundary of the zones so as to delimit the various active zones.

The requirements in terms of dependability of operation are severe and during tests performed, the Applicant has found that lateral bearings on the rib of an active zone may trigger the control of the adjacent zone by simple transmission in the form of a deformation couple of the bearing force.

When it is known that these devices must often be used blindly while driving the vehicle, it is understood that it is necessary to alleviate this drawback.

The aim of the present invention is therefore to propose an electrical control device which decreases the risk of erroneous controls.

For this purpose, the subject of the invention is a tactile surface based electrical control device comprising at least two adjacent active zones for controlling in each active zone a specific electrical function and an overlay arranged on the tactile surface and exhibiting surface ribs so as to delimit said active control zones, characterized in that the lower face of a rib, separating two adjacent active zones, is made in the manner of a tensioned vault between two pillars which bear only outside the active zones of the tactile surface.

Other advantages and characteristics will become apparent on reading the description of the invention, and appended drawings in which:

FIG. 1 shows a perspective view of a tactile surface based electrical control device 1 for a motorized mechanism (not represented) for opening and/or closing an openable panel, such as for example a window of a motor vehicle, a sunroof or else the trunk/tailgate/motorized sliding door of a vehicle.

Figure 1:
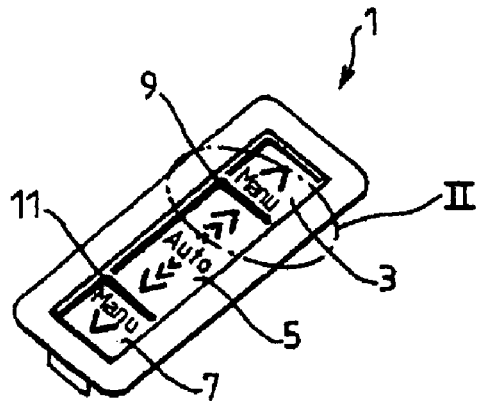
FIG. 1 is a perspective view of a control device according to the invention.

This device comprises at least two, in the present example three, active zones 3, 5 and 7. The device is configured in such a manner that each zone makes it possible to control a specific electrical function.

Zone 3 is for example for a control for closing the openable panel in so-called "manual" mode, that is to say as long as a finger is bearing on this zone, a motor for moving the openable panel is activated and moves the openable panel, at most until it comes into abutment in the completely closed position.

In an analogous manner, zone 7 is for example for a control for opening the openable panel in so-called "manual" mode, that is to say as long as a finger is bearing on this zone, the motor for moving the openable panel is activated and moves the openable panel, at most until it comes into abutment in the complete closure position.

Zone 5 is an active so-called "gliding" zone, that is to say not only is the bearing of a finger of the user detected, but also the motion thereof, in particular the direction of movement of a finger of the user. As a function of the direction of motion in this zone 5, the motor for moving the openable panel closes (motion of the finger towards zone 3) or opens (motion of the finger towards zone 7) the openable panel.

The active zones 3 and 5 as well as 5 and 7 are inter-delimited by surface ribs 9 and 11. These surface ribs therefore make it possible to orient the user "haptically" and make it possible to carry out so-called "blind" control. Optionally, without departing from the present invention, it is possible to envisage that each zone is surrounded by such a surface rib.

Figure 2A:
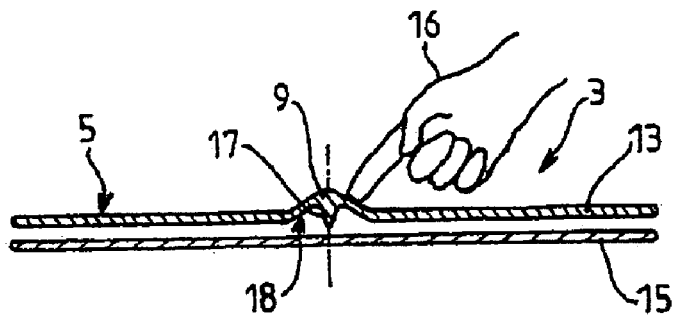
FIG. 2A is a view in longitudinal section of a detail II of the device according to the invention.

FIG. 2A presents in longitudinal section a detail II of the device of FIG. 1.

In this figure may be seen in particular the overlay 13 which is for example made of an elastic material, preferably rubber or silicone, and is arranged on the tactile surface 15.

The tactile surface 15 forms part of a tactile sensor made according to a known technology. However, preferably, a tactile sensor using pressure sensitive resistors (also known as an FSR sensor, the initials standing for "Force Sensing Resistor") is used.

Although it is possible to envisage a dedicated tactile sensor for each active zone, it is preferred that the device 1 comprise a single tactile sensor with a tactile surface for all the active zones and generating signals corresponding to the bearing coordinates. In this case, the coordinates delivered by the sensor are utilized for carrying out the control of a specific electrical function associated with the zone touched by a user's hand.

The rib 9 exhibits a triangular shape in transverse section. The lower face 18 of the rib 9, opposite the tactile sensor 15, is made in the manner of a tensioned vault 20 (see in particular FIG. 2C) between for example two pillars 17 (see FIG. 2C presenting a longitudinal section of the detail II) which bear only outside the active zones of the tactile surface.

Figure 2C:
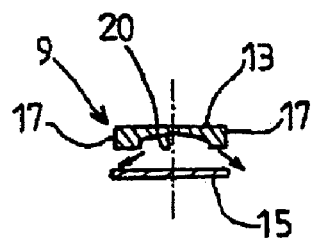
FIG. 2C is a transverse cross-sectional view of a detail II of the device according to the invention.
Figure 2B:
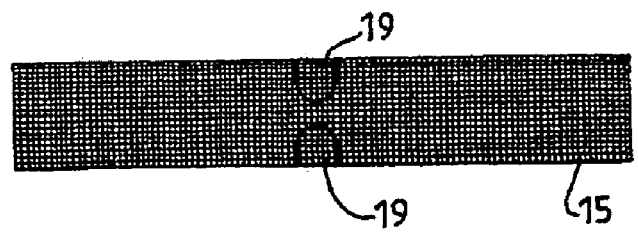
FIG. 2B is a view from above of a detail II of the tactile sensor of the device according to the invention.

As seen in FIGS. 2A and 2C taken together, the pillars 17 are arranged at the ends of the rib 9 and form a central bearing leg.

Thus, a lateral bearing against the rib 9 (see for example FIG. 2A) is no longer transmitted to an adjacent active zone of the device.

Preferably, at the level of the delimitation of two adjacent active zones 3 and 5 as well as 5 and 7, the tactile surface 15 comprises two inactive lateral regions 19 and the pillars 17 are in contact with the sensor 15 in these zones 19, also called dead zones.

Such an arrangement is advantageous, since it makes it possible to reduce the proportions of the device according to the invention.

The advantages of the present invention are therefore understood, in particular when a finger glides for example over the active zone 5 and abuts against one of the two ribs 11 or 9. By virtue of the specific configuration of the lower face 18 of the rib 9, the lateral bearing forces are diverted to non-active zones of the sensor, thus preventing any risk of maloperation.

The invention claimed is:

1. A tactile surface based electrical control device comprising at least two adjacent active zones for controlling in the active zone a specific electrical function and an overlay arranged on the tactile surface and exhibiting surface ribs so as to delimit said active control zones characterized in that the lower face of a rib, separating two adjacent active zones, is made in the manner of a tensioned vault between pillars which bear only outside the active zones of the tactile surface.

2. The device as claimed in claim 1, characterized in that the rib exhibits a triangular general shape in cross-section, the pillars being arranged at the ends of the rib and forming a central bearing leg.

3. The device as claimed in claim 1, characterized in that at the level of the delimitation of two adjacent active zones, the tactile surface comprises two inactive lateral regions and in that the pillars of the rib bear on these inactive zones.

4. The device as claimed in claim 1 characterized in that the tactile surface forms part of a bearing-dependent variable-resistance FSR sensor.

5. The device as claimed in claim 1 characterized in that the overlay is made of an elastic material, preferably rubber or silicone.

6. The device as claimed in claim 1 characterized in that the device comprises a single tactile surface generating signals corresponding to the bearing coordinates.

7. An electrical control device comprising:
a tactile surface having at least two adjacent active zones, said tactile surface for controlling a specific electrical function in at least some of the active zones;
an overlay disposed on the tactile surface, said overlay having ribs projecting from a surface thereof wherein said ribs delimit said active zones; and
wherein a lower face of a rib, separating two adjacent active zones, is made in the manner of a tensioned vault between pillars which bear only outside the active zones of said tactile surface.

8. The device as claimed in claim 7, wherein the rib is provided having first end second ends and a generally triangular cross-sectional shape and the pillars are arranged at the ends of the rib and form a central bearing leg.

9. The device as claimed in claim 7 wherein at the level of the delimitation of two adjacent active zones, said tactile surface comprises two inactive lateral regions and the pillars of the rib bear on these inactive zones.

10. The device as claimed in claim 7 wherein the tactile surface forms part of a bearing-dependent variable-resistance FSR sensor.

11. The device as claimed in claim 7 wherein the overlay is provided from an elastic material.

12. The device as claimed in claim 7 wherein the overlay comprises at least one of a rubber material or a silicone material.

13. The device as claimed in claim 7 wherein the device comprises a single tactile surface which generates signals corresponding to bearing coordinates.

14. An electrical control device comprising:
a tactile surface having a plurality of active zones, with each of the plurality of active zones for controlling at least one specific electrical function;
an overlay disposed on the tactile surface, said overlay having ribs projecting from a surface thereof wherein said ribs delimit at least some of the plurality of active zones with at least one of the ribs having a lower face which separates at least two active zones and wherein the lower face of the rib forms a tensioned vault between pillars which bear only outside the active zones of said tactile surface.

15. The electrical control device of claim 14 wherein said tactile surface has at least two adjacent active zones.

16. The electrical control device of claim 15 wherein at least one of the ribs has a lower face which separates two adjacent active zones.

17. The electrical control device of claim 15 comprising one or more sensors per active zone.

18. The electrical control device of claim 15 wherein said ribs are disposed to orient a user haptically.

19. The electrical control device of claim 15 wherein said tactile surface corresponds to a single tactile surface and the device further comprises a single tactile sensor.

* * * * *